United States Patent [19]

Schmuck

[11] Patent Number: 5,497,385
[45] Date of Patent: Mar. 5, 1996

[54] OPTICAL MICROWAVE GENERATOR

[75] Inventor: Harald Schmuck, Korntal-Münchingen, Germany

[73] Assignee: Alcatel SEL Aktiengesellschaft, Stuttgart, Germany

[21] Appl. No.: 181,182

[22] Filed: Jan. 13, 1994

[30] Foreign Application Priority Data

Jan. 16, 1993 [DE] Germany ............................ 43 01 031.8

[51] Int. Cl.$^6$ ............................................. H01S 3/30
[52] U.S. Cl. .................... 372/6; 372/94; 372/98
[58] Field of Search ............................. 372/6, 94, 98, 372/27

[56] References Cited

U.S. PATENT DOCUMENTS

| | | | |
|---|---|---|---|
| 5,239,607 | 8/1993 | da Silva et al. | 372/94 |
| 5,251,053 | 10/1993 | Heidemann. | |
| 5,309,455 | 5/1994 | Adachi et al. | 372/6 |

OTHER PUBLICATIONS

"Simultaneous Oscillation of Wavelength–Tunable, Singlemode Lasers using an Er–Doped Fibre Amplifier", by H. Okamura and K. Iwatsuki, Electronics Letters, 27 Feb. 1992, vol. 28, No. 5 pp. 461–463.

Applied Physics Letters, BD 60, NR. 25, 22, Jun. 1992, New York US Seiten 3090–3092, XP000280693 J. W. Dawson et al. "Co–lasing in an elect–rically tunable erbium–dopes fiber laser".

Electronics Letters, Bd. 28, Nr. 5, 27. Feb. 1992, Stevenage GB, Seiten 461–463, XP000292686m G, Okamura et al. 'Simultaneous oscillation of wavelength–tunable, singlemode lasers using an Er–doped fibre amplifier'.

Electronics Letters, Bd. 27, Nr. 22, 24. Oct. 1991, Stevenage GB Seiten 2033–2035, XP000265995 D. Culverhouse et al. 'Stimulated Brillouin scattering ring resonator laser for SBS gain studies and microwave generation'.

*Primary Examiner*—Rodney B. Bovernick
*Assistant Examiner*—Robert E. Wise
*Attorney, Agent, or Firm*—Ware, Fressola, Van Der Sluys & Adolphson

[57] ABSTRACT

The invention relates to a microwave generator which is characterized by a multimode fiber ring laser (1) having associated with it an intermediate-frequency device (22) which generates the microwave frequency by forming the difference of the frequencies assigned to the modes.

25 Claims, 4 Drawing Sheets

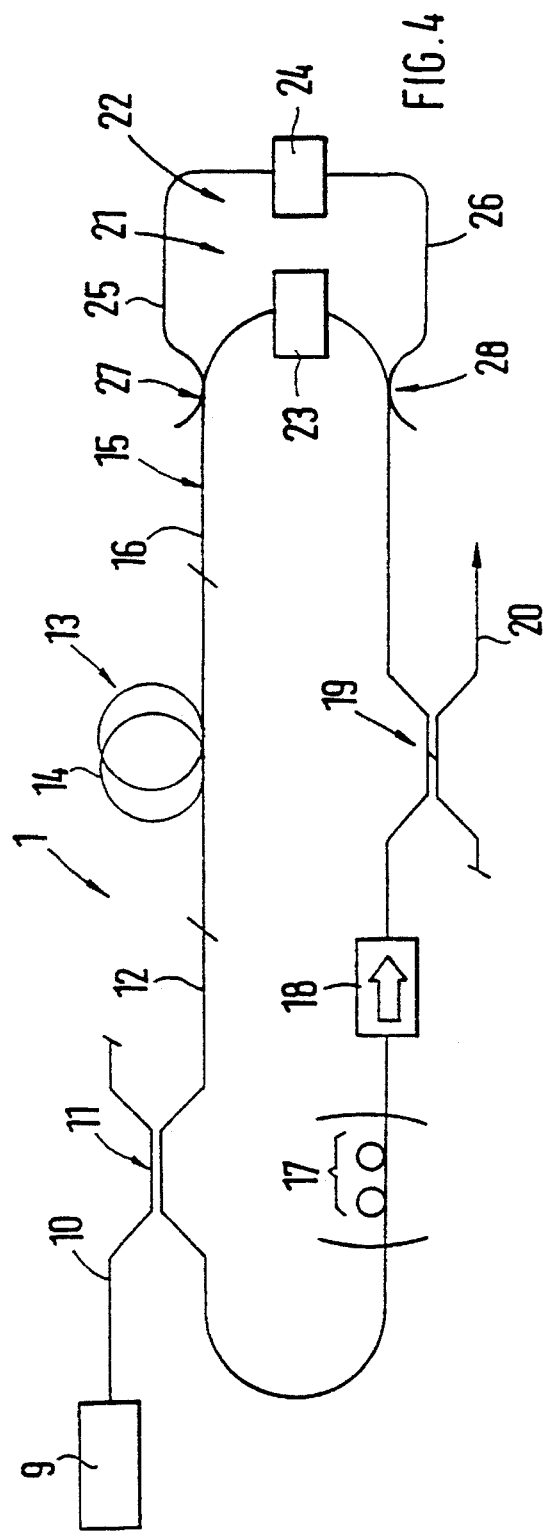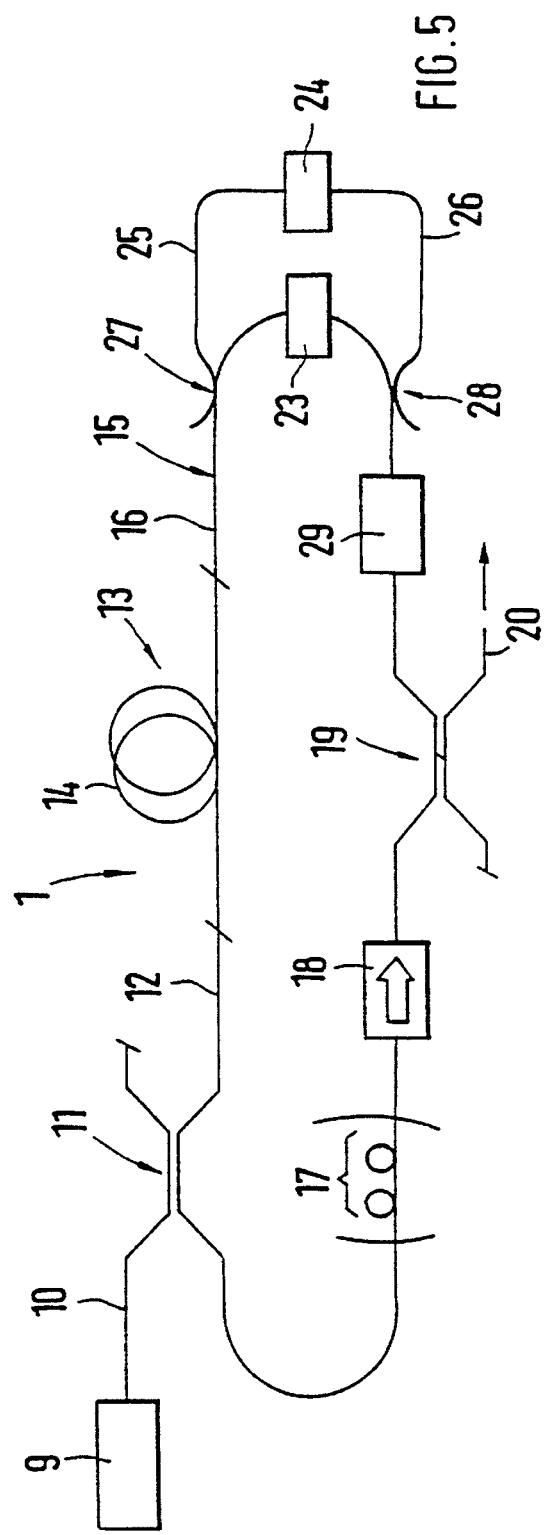

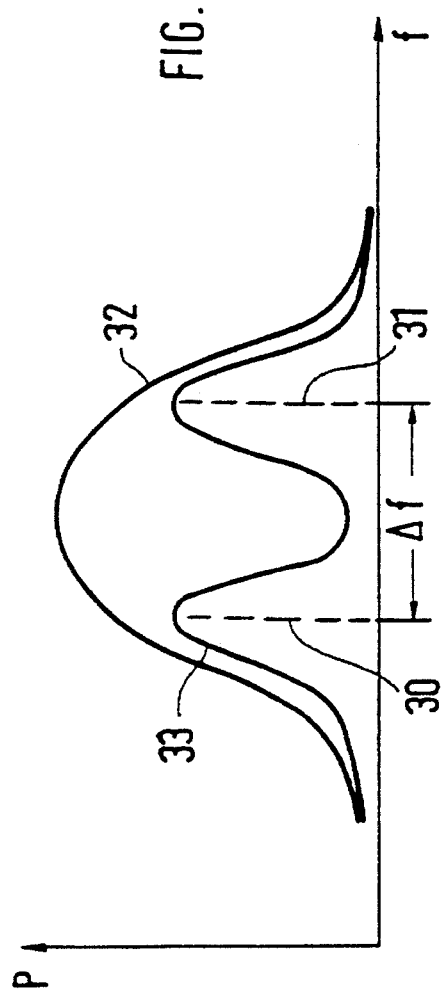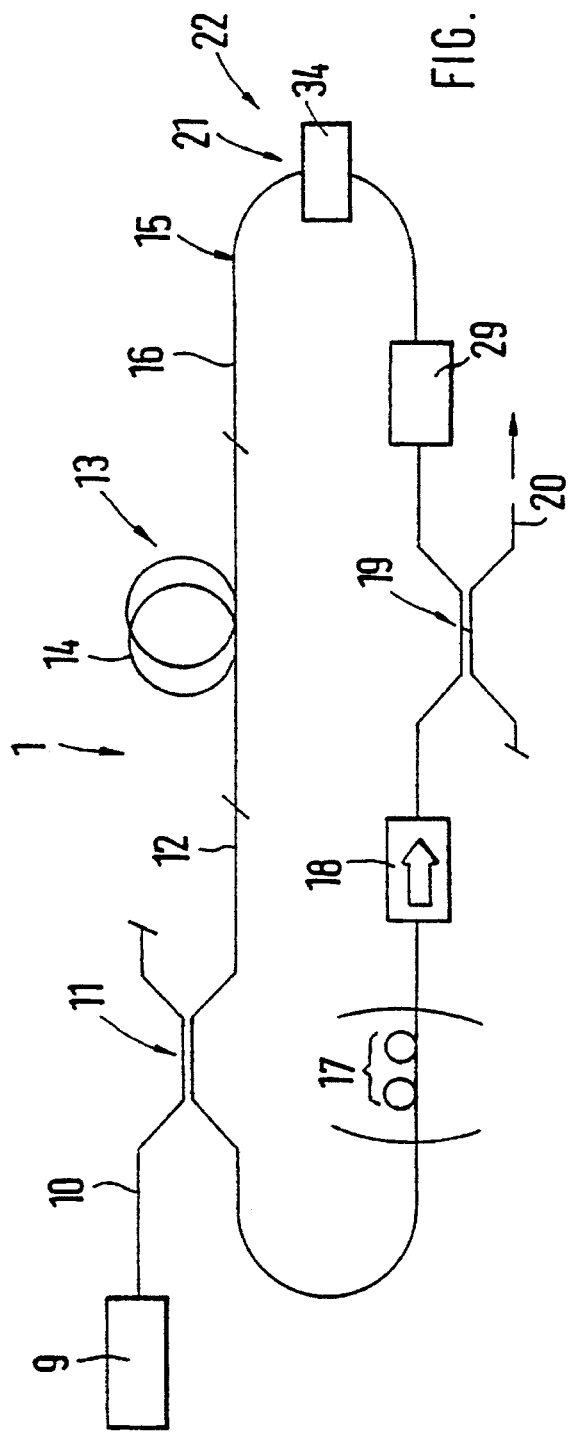

OPTICAL MICROWAVE GENERATOR

TECHNICAL FIELD

The present invention relates to a microwave generator.

BACKGROUND OF THE INVENTION

U.S. Pat. No. 5,251,053 discloses a radio communication system, particularly a cellular mobile-radio system, which comprises two optical transmitters having different frequencies. By forming the difference of the two frequencies, a carrier frequency is provided. A frequency regulator is provided for maintaining the frequency difference. Disadvantages are the use of two optical devices and the relatively costly frequency regulator.

From "Electronics Letters", 27th Feb. 1992, Vol. 28, No. 5, page 461, "Simultaneous Oscillation of Wavelength-Tunable, Singlemode Lasers Using an Er-Doped Fiber Amplifier", it is known to use a fiber ring laser with a bypass for generating a plurality of frequencies. Microwave generation, particularly with regard to the formation of a frequency difference, is not dealt with in that reference.

SUMMARY OF THE INVENTION

It is the object of the invention to provide a microwave generator of simple construction. Furthermore, a stable intermediate frequency is to be produced in the microwave generator without the use of expensive means, such as a closed-loop control system or the like.

This object is attained by providing a fiber ring laser which generates light of a plurality of optical frequencies and which has associated with it an intermediate-frequency device generating the microwave frequency by forming the difference of selected frequencies. Thus, an essential idea of the invention is to generate microwaves by means of an optical device, namely a fiber ring laser. To form the microwave frequency, use is made of an intermediate-frequency device which, by forming the difference between selected modes of the fiber ring laser, makes available an intermediate frequency and, thus, the microwave frequency.

The fiber ring laser preferably comprises a fiber ring with a preferably frequency-band-determining optical waveguide.

The intermediate-frequency device preferably comprises an optical filter arrangement with two selective passbands for different optical frequencies.

The fiber ring advantageously contains polarization-sensitive means generating preferably two orthogonal natural modes, which are assigned different frequencies whose difference is equal to the intermediate frequency. The selective passbands of the optical filter arrangement are preferably chosen to coincide with the frequencies assigned to the natural polarization modes.

The foregoing statements show that only one laser light source, namely the fiber ring laser, is needed to excite, by the polarization-sensitive means, the orthogonal natural modes, which have a fixed frequency spacing. Since this frequency spacing is constant, there is no need for complicated and costly feedback control systems as are required in the prior art. The intermediate-frequency device includes the optical filter arrangement to select the two light waves to be superimposed, the polarization-sensitive filter arrangement being selective with respect to each of the two natural polarization modes. In this manner, the stable intermediate frequency and, thus, a stable-frequency microwave signal are produced by simple means. By the split into orthogonal natural modes by polarization-sensitive means, two independent ring resonators are formed.

In a preferred embodiment of the invention, the polarization-sensitive means are at least one polarization-maintaining optical waveguide of the fiber ring. By this optical waveguide, all fibers, fiber couplers, etc. contained in the ring are to be understood, i.e., all components have a polarization-maintaining effect. Preferably, one of the optical waveguides is doped, particularly with erbium ($Er^{3+}$).

The optical filter arrangement preferably has two filters which are arranged in parallel in the fiber ring. It is also possible to use an optical filter arrangement which comprises a filter with a free spectral range (FSR) corresponding to the intermediate frequency $\Delta f$.

In another preferred embodiment of the invention, the optical filter arrangement has associated with it a prefilter which is contained in the fiber ring and whose bandwidth includes the two passbands of the filter arrangement. The prefilter thus forms a sort of coarse filter to select a given range from the plurality of laser modes and eliminate the other modes. Within this range, the optical filter arrangement then selects two modes which are separated by a distance $\Delta f$ corresponding to the frequency of the microwave signal.

If no polarization-maintaining fiber is used in the fiber ring laser, it is necessary to provide a polarization controller. This is necessary, for example, if a standard single mode fiber is used in the fiber ring.

Preferably, the fiber ring contains a polarization-insensitive isolator, which determines the direction of the light waves in the fiber ring.

The fiber ring preferably contains a wavelength-dependent gain-matching element. This may be an attenuator, for example. It serves to cause the two selected modes to start oscillating uniformly so as to prevent one mode from having a greater amplitude than the other at the start of oscillations. This could result in the mode with the greater amplitude remaining dominant, so that the other mode would not be available to the same extent. The gain-matching element thus provides a compensation.

BRIEF DESCRIPTION OF THE DRAWINGS

Embodiments of the invention will now be described with reference to the accompanying drawings, in which:

FIG. 4 shows one embodiment of an optical microwave generator;

FIG. 5 shows another embodiment of an optical microwave generator;

FIG. 6 shows a graph,

FIG. 7 shows a last embodiment of an optical microwave generator, and

BEST MODE FOR CARRYING OUT THE INVENTION

Figure 1:
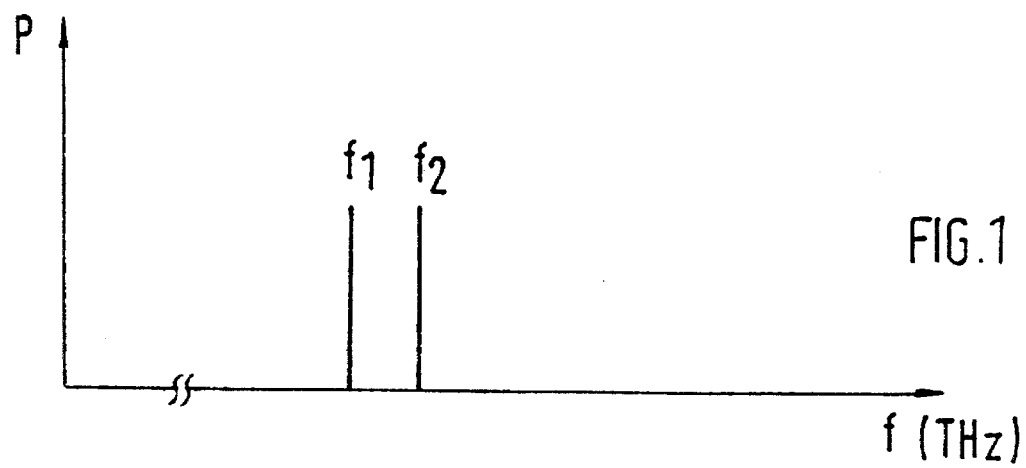
FIG. 1 shows a graph.

FIG. 1 shows a graph with the aid of which the principle of operation of the novel optical microwave generator will be explained. The ordinate shows the power output of a laser, and the abscissa the frequency of the output signal. Since the output consists of light waves, the frequency lies in the terahertz (THz) range. If the laser provides a first frequency $f_1$ and a second frequency $f_2$ differing from the first, and a frequency difference $\Delta f = f_2 - f_1$ is formed, an "intermediate-frequency signal" is obtained which represents a microwave signal and lies in, e.g., the GHz range.

Figure 2:
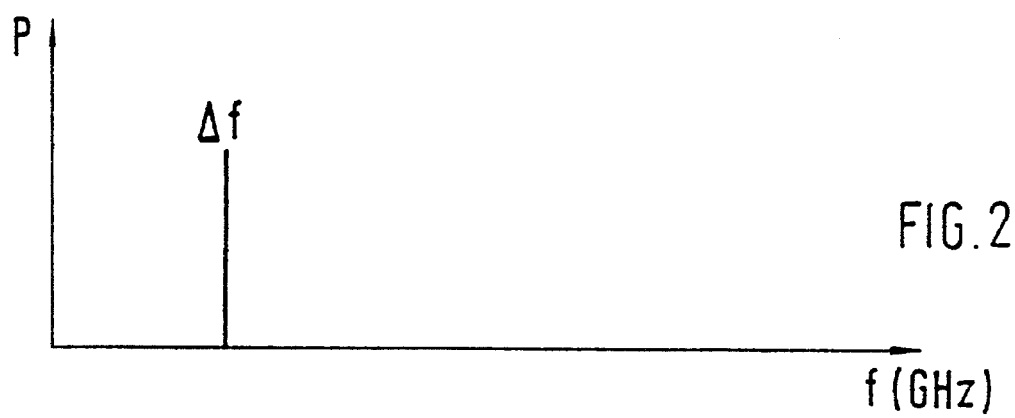
FIG. 2 shows another graph.
Figure 3:
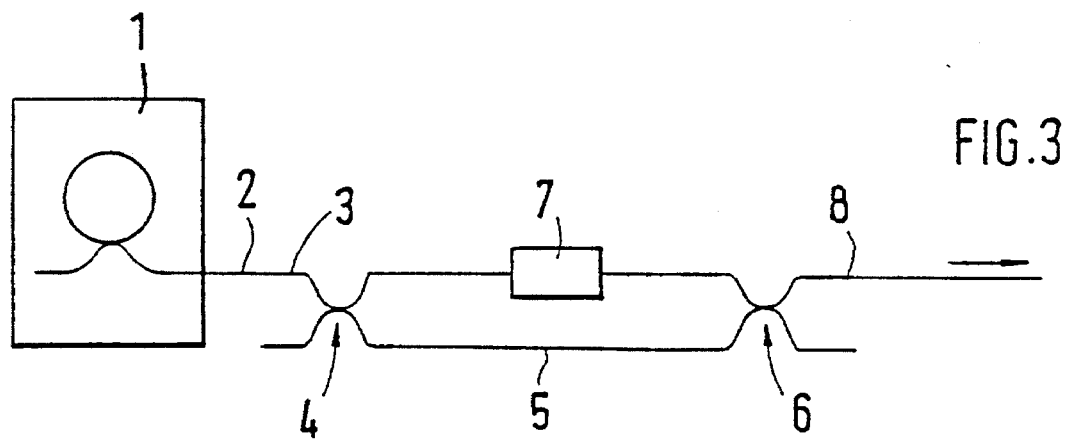
FIG. 3 shows a fiber ring laser with a modulating device.
Figure 8:
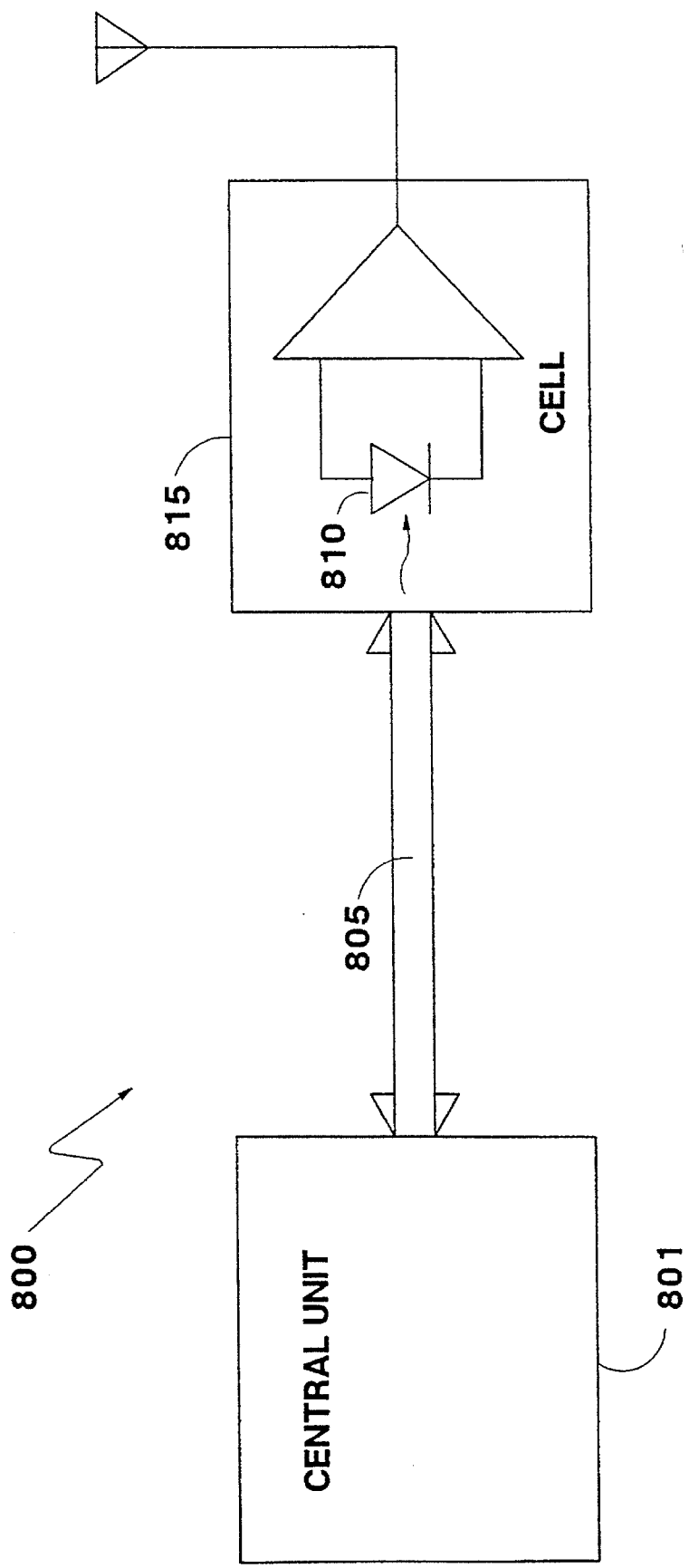
FIG. 8 is a schematic block diagram of a cellular mobile-radio system which may use the optical microwave generator of the present invention.

FIG. 2 shows the frequency difference $\Delta f$, which may amount to 60 GHz, for example. This frequency is used as a carrier frequency. Referring to FIG. 8 in a cellular mobile-radio system 800, for example, the carrier signal is applied from a central unit 801 over an optical waveguide 805 to an optical-to-electrical transducer 810 which is located in a cell 815, i.e., a cell of a cellular mobile-radio system, and converts the signal to an electric microwave signal. This carrier frequency can be modulated as shown in FIG. 3. To this end, a fiber ring laser 1 is provided whose output 2 acts on a polarization-selective coupler 4 via an optical waveguide 3. The coupler 4 is connected by an optical waveguide 5 to another polarization-selective coupler 6. Arranged in parallel with the optical waveguide 5 is an optical waveguide 2 which contains a modulator that affects amplitude, frequency, or phase modulation. One output of the coupler 6 is connected to an optical waveguide 8 which carries the modulated carrier-frequency signal.

The fiber ring laser, designated 1 in FIG. 3, will now be explained in more detail with reference to FIGS. 4, 5, and 7.

The fiber-ring laser 1 of FIG. 4 includes a pump laser 9, which operates at a wavelength v of 980 nm, for example. The pump laser 9 is connected to a fiber ring 12 via an optical waveguide 10 and a wavelength-selective, polarization-maintaining coupler 11. The fiber ring 12 comprises a frequency-band-determining optical waveguide 13 in the form of, e.g., an erbium-doped fiber 14 ($Er^{3+}$-doped fiber). The fiber ring 12 further comprises polarization-sensitive means 15, which include the frequency-band-determining optical waveguide 13 and an optical waveguide 16. Both optical waveguides 13 and 16 are polarization-maintaining optical waveguides. If, in another embodiment, standard single-mode fibers are used instead of polarization-maintaining optical waveguides, the fiber ring 12 will contain a polarization controller 17. This alternative is indicated in FIGS. 4, 5, and 7 by parentheses. The fiber ring 12 further includes an optical isolator 18, which is polarization-insensitive, and a coupler 19, which couples one output signal to an optical waveguide 20.

Furthermore, an optical filter arrangement 21, which represents an intermediate-frequency device 22, is connected into the fiber of the polarization-maintaining optical waveguide 16. The intermediate-frequency device 22 comprises a first filter 23 and a second filter 24. The second filter 24 is connected in parallel with the first filter 23 by means of polarization-maintaining optical waveguides 25 and 26 as well as polarization-maintaining couplers 27 and 28.

In operation, the pump laser 9 excites light waves in the fiber ring 12 which, because of the optical isolator, "circulate" in a predetermined direction, the doping with erbium resulting in a wavelength of v=1550 nm, for example. The two filters 23 and 24 select, from the plurality of longitudinal modes, two modes which are separated by a space corresponding to the desired intermediate frequency $\Delta f$. The polarization-maintaining optical waveguides 16, 25, and 26 are designed to excite orthogonal natural modes. Because of the different refractive indices and the resonance conditions in the fiber ring 12 and because of the filters 23, 24, these two natural polarization modes have different frequencies, such that their frequency difference is just equal to the desired intermediate frequency. In this manner, a useful signal in the form of a microwave signal is generated.

The embodiment of FIG. 5 differs from that of FIG. 4 in that the fiber ring 12 additionally contains a prefilter 29 whose bandwidth includes the two passbands of the filter arrangement 21. This is illustrated in the graph of FIG. 6, where the two orthogonal natural modes 30 and 31 determining the frequency difference $\Delta f$ are indicated. The prefilter 29 has the characteristic designated 32, i.e., from the plurality of modes (not shown in FIG. 6), one range is selected in which the two natural modes 30 and 31 are located. By means of the optical filter arrangement 21, the two natural modes 30 and 31 are selected from the range already selected by the prefilter 29. This is illustrated in FIG. 6 by means of the characteristic 33.

The frequencies $f_1$ and $f_2$, excited by the two orthogonal modes, are preferably determined by the characteristics of the polarization-maintaining optical waveguides (e.g., by differing effective indices of refraction of the natural modes) and/or by adaptation of the fiber-ring length. They are chosen so that their difference $f_2 - f_1 = \Delta f$ is equal to the desired microwave frequency.

In this manner, a stable intermediate frequency is achieved by simple means.

The embodiment shown in FIG. 7 differs from the embodiment of FIG. 5 only in that instead of the two filters 23 and 24 of the optical filter arrangement 2 1 forming an intermediate-frequency device 22, only one filter 34 is used, which has the same characteristic as in FIG. 6, however. Thus, a free spectral range FSR of width $\Delta f$ is present.

In the embodiments, the invention is built of discrete components, but it can also be implemented, wholly or in part, using integrated optical technology.

I claim:

1. A microwave generator, characterized by:
    a fiber ring laser (1) which generates light of a plurality of optical frequencies and
    an intermediate-frequency device (22), optically connected to said fiber ring laser, said intermediate-frequency device including:
        means responsive to said light of a plurality of optical frequencies for selecting light of at least two of said plurality of optical frequencies, and
        means for generating an intermediate frequency ($\Delta f$) optical signal having a frequency which is the difference between said at least two of said plurality of optical frequencies, the frequency of said intermediate frequency optical signal being a microwave frequency.

2. A microwave generator as claimed in claim 1, characterized in that the fiber ring laser (1) comprises a pump laser (9) and a fiber ring (12), said fiber ring (12) including a first coupler (11) which couples light which is emitted by the pump laser (9) into the fiber ring, a frequency-band-determining optical waveguide (13) which is excited by the light emitted by the pump laser (9), and a second coupler (19) which couples light out of the fiber ring (12).

3. A microwave generator as claimed in claim 2, characterized in that said means responsive to said light of a plurality of optical frequencies comprises an optical filter arrangement (21) with two selective passbands for different optical frequencies, said optical filter arrangement being positioned in the fiber ring (12).

4. A microwave generator as claimed in claim 3, characterized in that the fiber ring (12) further includes polarization-sensitive means (15) for generating two orthogonal natural modes (30, 31), which are assigned different frequencies ($f_1$, $f_2$) whose difference is equal to the frequency Of said intermediate frequency ($\Delta f$) optical signal.

5. A microwave generator as claimed in claim 4, characterized in that the selective passbands of the optical filter arrangement (21) are equal to the frequencies assigned to the two orthogonal natural modes (30, 31), respectively.

6. A microwave generator as claimed in claim 4, characterized in that the polarization-sensitive means (15) are at least one polarization-maintaining optical waveguide (11, 13, 16, 19, 25, 26, 27, 28) forming part of the fiber ring (12).

7. A microwave generator as claimed in claim 3, characterized in that the optical filter arrangement (21) comprises two filters (23, 24) which are arranged in parallel in the fiber ring (12).

8. A microwave generator as claimed in claim 3, characterized in that the optical filter arrangement (21) comprises a filter (34) with a free spectral region (FSR), the width of the free spectral region (FSR) being equal to the frequency of said intermediate frequency($\Delta f$) optical signal.

9. A microwave generator as claimed in claim 3, characterized in that the fiber ring (12) further comprises a prefilter (29) having a bandwidth which includes the two selective passbands of the filter arrangement (21).

10. A microwave generator as claimed in claim 2, characterized in that the frequency-band-determining optical waveguide (13) is doped with erbium ($Er^{3+}$).

11. A microwave generator as claimed in claim 2, characterized in that the fiber ring (12) contains a polarization controller (17).

12. A microwave generator as claimed in claim 2, characterized in that the fiber ring (12) contains polarization-insensitive isolator (18).

13. A microwave generator as claimed in claim 2, characterized in that the fiber ring (12) contains wavelength-dependent gain-matching element.

14. A microwave generator as claimed in claim 1, characterized in that the fiber ring laser (1) is contained in a central unit, and that the intermediate frequency ($\Delta f$) optical signal is converted in an optical-to-electrical transducer to an electric microwave signal.

15. A microwave generator as claimed in claim 14, characterized in that the optical-to-electrical transducer is located in a cell of a cellular mobile-radio system and is connected to the central unit by an optical waveguide.

16. A microwave generator as claimed in claim 1, characterized in that said means responsive to said light of a plurality of optical frequencies comprises an optical filter arrangement (21 ) with two selective passbands for different optical frequencies.

17. A microwave generator as claimed in claim 1, characterized in that the fiber ring (12) contains polarization-sensitive means (15) for generating two orthogonal natural modes (30, 31), which are assigned different frequencies ($f_1$, $f_2$) whose difference is equal to the frequency of said intermediate frequency ($\Delta f$) optical signal.

18. An optical transmitter comprising:
a pump laser; and
a fiber ring, including:
   a first coupler for coupling light emitted by the pump laser into the fiber ring;
   a second coupler for coupling light out of the fiber ring;
   a rare earth doped fiber positioned between the first and second couplers;
   an optical filter arrangement positioned between the first and second couplers, said optical filter arrangement being adapted to pass light having two selective bands for light of two different optical frequencies; and
   polarization-sensitive means for generating two orthogonal natural modes which are assigned different optical frequencies, the difference between the different optical frequencies being an intermediate frequency ($\Delta f$) optical signal.

19. An optical transmitter as claimed in claim 18, wherein the two selective bands of the optical filter arrangement are equal to the frequencies assigned to the two orthogonal natural modes, respectively.

20. An optical transmitter as claimed in claim 18, wherein the polarization-sensitive means are at least one polarization-maintaining optical waveguide forming part of the fiber ring.

21. An optical transmitter as claimed in claim 18, wherein the optical filter arrangement includes two filters which are arranged in parallel in the fiber ring.

22. An optical transmitter as claimed in claim 18, wherein the optical filter arrangement includes a filter (34) having a free spectral region (FSR), the width of the free spectral region (FSR) being equal to the frequency of the intermediate frequency ($\Delta f$) optical signal.

23. An optical transmitter as claimed in claim 18, wherein the intermediate frequency ($\Delta f$) optical signal provides a carrier frequency for a central unit of a cellular mobile-radio system.

24. An optical transmitter as claimed in claim 23, wherein the carrier frequency is converted in an optical-to-electrical transducer to an electric microwave signal.

25. An optical transmitter as claimed in claim 23, further including means for modulating the carrier frequency.

\* \* \* \* \*

UNITED STATES PATENT AND TRADEMARK OFFICE
CERTIFICATE OF CORRECTION

PATENT NO. : 5,497,385
DATED : March 5, 1996
INVENTOR(S) : Schmuck

It is certified that error appears in the above-indentified patent and that said Letters Patent is hereby corrected as shown below:

Column 4, line 39 (claim 1), after "frequencies" insert --;--.

Column 4, line 43 (claim 1), insert --(a)-- before "means responsive".

Column 4, line 46 (claim 1), insert --(b)-- before "means for generating"

Column 5, line 6 (claim 5), insert --two-- before "selective passbands".

Signed and Sealed this

Thirtieth Day of July, 1996

Attest:

BRUCE LEHMAN

Attesting Officer

Commissioner of Patents and Trademarks